US012813149B2

(12) United States Patent
Hou et al.

(10) Patent No.: US 12,813,149 B2
(45) Date of Patent: Nov. 24, 2026

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Peng Hou, Beijing (CN); Yuan He, Beijing (CN); Yunhao Wang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 429 days.

(21) Appl. No.: 18/560,409

(22) PCT Filed: Oct. 25, 2021

(86) PCT No.: PCT/CN2021/126058

§ 371 (c)(1),
(2) Date: Nov. 13, 2023

(87) PCT Pub. No.: WO2022/242030

PCT Pub. Date: Nov. 24, 2022

(65) Prior Publication Data

US 2024/0260431 A1 Aug. 1, 2024

(30) Foreign Application Priority Data

May 19, 2021 (CN) ......................... 202110543907.2

(51) Int. Cl.
*H10K 59/86* (2023.01)
*H10K 59/122* (2023.01)
*H10K 59/80* (2023.01)

(52) U.S. Cl.
CPC ....... *H10K 59/8792* (2023.02); *H10K 59/122* (2023.02); *H10K 59/80518* (2023.02)

(58) Field of Classification Search
CPC .................................................. H10K 59/8792
(Continued)

(56) References Cited

U.S. PATENT DOCUMENTS 10,553,662 B2 2/2020 Lee et al.
2015/0008417 A1 1/2015 Ochi et al.
(Continued)

FOREIGN PATENT DOCUMENTS

CN 104094669 A 10/2014
CN 108493230 A 9/2018
(Continued)

OTHER PUBLICATIONS

International Search Report for PCT/CN2021/126058 Mailed Feb. 18, 2022.

(Continued)

*Primary Examiner* — Christopher M Raabe

(57) ABSTRACT

A display substrate and a display device are provided in the present invention. The display substrate includes: a base substrate; a black matrix, located above the base substrate, the black matrix including a plurality of first openings, each first opening including a first portion and a second portion, and the first portion being provided around the second portion; a pixel defining layer, located between the layer where the black matrix is located and the base substrate, the pixel defining layer including a plurality of second openings, an orthographic projection of the second opening on the base substrate overlapping with an orthographic projection of the second portion on the base substrate, and the orthographic projection of the second opening on the base substrate not
(Continued)

overlapping with an orthographic projection of the first portion on the base substrate.

12 Claims, 7 Drawing Sheets

(58) Field of Classification Search
USPC .................................................. 313/498–512
See application file for complete search history.

(56) References Cited

U.S. PATENT DOCUMENTS

| | | | | |
|---|---|---|---|---|
| 2019/0097168 | A1 | 3/2019 | Pang | |
| 2020/0212346 | A1 | 7/2020 | Lee | |
| 2021/0233966 | A1 | 7/2021 | Xu et al. | |
| 2021/0367008 | A1 | 11/2021 | Hu et al. | |
| 2021/0376003 | A1* | 12/2021 | Xu | G06F 3/0412 |
| 2021/0399081 | A1* | 12/2021 | Park | H10K 59/121 |
| 2022/0415981 | A1 | 12/2022 | Shu et al. | |

FOREIGN PATENT DOCUMENTS

| | | | |
|---|---|---|---|
| CN | 109560210 | A | 4/2019 |
| CN | 111326636 | A | 6/2020 |
| CN | 111384289 | A | 7/2020 |
| CN | 112106204 | A | 12/2020 |
| CN | 113285044 | A | 8/2021 |

OTHER PUBLICATIONS

Office Action dated Mar. 3, 2022 for Chinese Patent Application No. 202110543907.2 and English Translation.
Office Action dated Nov. 3, 2022 for Chinese Patent Application No. 202110543907.2 and English Translation.

* cited by examiner

DISPLAY SUBSTRATE AND DISPLAY DEVICE

CROSS-REFERENCE TO RELATED APPLICATION

The present application is a U.S. National Phase Entry of International Application No. PCT/CN2021/126058 having an international filing date of Oct. 25, 2021, which claims priority to the Chinese patent application No. 202110543907.2, entitled “DISPLAY SUBSTRATE AND DISPLAY DEVICE”, filed to the CNIPA on May 19, 2021. The above-identified applications are hereby incorporated by reference.

TECHNICAL FIELD

The present disclosure relates to the field of display technologies, and particularly to a display substrate and a display device.

BACKGROUND

Organic Light-Emitting Diode (OLED) display panels have many advantages, such as self-luminescence, ultra-thin, fast reaction speed, high contrast, wide viewing angle, production possibility in flexible products and the like, and are widely used in high-performance display fields.

SUMMARY

Embodiments of the present disclosure provide a display substrate and a display device, specific schemes of which are as follows.

In a first aspect, a display substrate is provided in an embodiment of the present disclosure, which includes: a base substrate; a black matrix, which is located on the base substrate, and includes a plurality of first openings, wherein an first opening includes a first portion and a second portion that is wound by the first portion; a pixel definition layer, which is located between a layer where the black matrix is located and the base substrate; wherein the pixel definition layer includes a plurality of second openings, an orthographic projection of the second openings on the base substrate is intersected with an orthographic projection of the second portions on the base substrate, and the orthographic projection of the second openings on the base substrate is not intersected with an orthographic projection of the first portions on the base substrate; a plurality of light emitting devices which are located between the layer where the black matrix is located and the base substrate, wherein a light emitting device includes a reflecting electrode disposed at a second opening; and a shading layer that is located between the pixel definition layer and the base substrate, and an orthographic projection of the shading layer on the base substrate covers, at least, an orthographic projection of the first portion on the base substrate.

Optionally, in the display substrate provided in the embodiment of the present disclosure, the shading layer includes a plurality of shading structures, and an orthographic projection of the shading structures on the base substrate overlaps with an orthographic projection of the first openings, outside a region where the reflecting electrodes are located, on the base substrate, and an orthographic projection of a portion of the black matrix adjacent to the first openings on the base substrate.

Optionally, in the display substrate provided in the embodiment of the present disclosure, the shading layer includes a plurality of shading structures, and an orthographic projection of the shading structures on the base substrate covers an orthographic projection of the first openings on the base substrate, and an orthographic projection of a portion of the black matrix adjacent to the first openings on the base substrate.

Optionally, in the display substrate provided in the embodiment of the present disclosure, the shading structure and the black matrix satisfy the following relationship:

$$a \geq \frac{12\ h\lambda}{b};$$

where a is a distance between a boundary of the orthographic projection of the shading structure on the base substrate away from the first opening and a boundary of the orthographic projection of the first opening on the base substrate, b is a distance between parallel sides of the first opening, h is a distance between the layer where the black matrix is located and a layer where the shading structures are located, and λ is a wavelength of incident light.

Optionally, in the display substrate provided in the embodiment of the present disclosure, the shading structure is in a same layer as the reflecting electrode, and a material of the shading structure is a black material.

Optionally, in the display substrate provided in the embodiment of the present disclosure, the shading structure and the reflecting electrode are in an integral structure.

Optionally, the display substrate provided in the embodiment of the present disclosure further includes a planarization layer located between the layer where the reflecting electrode is located and the base substrate; and the shading structure is located between the base substrate and the planarization layer.

Optionally, the display substrate provided in the embodiment of the present disclosure further includes a planarization layer located between the layer where the reflecting electrode is located and the base substrate; and the shading structure is located between the base substrate and the layer where the reflecting electrode is located.

Optionally, in the display substrate provided in the embodiment of the present disclosure, the light emitting device further includes a light emitting functional layer and a transmissive electrode; wherein the light emitting functional layer is located between a layer where the reflecting electrode is located and a layer where the transmissive electrode is located; and the transmissive electrode is located between the layer where the black matrix is located and the layer where the reflecting electrode is located.

Optionally, in the display substrate provided in the embodiment of the present disclosure, the transmissive electrodes of the plurality of light emitting devices are in an integral structure.

Optionally, the display substrate provided in the embodiment of the present disclosure further includes a plurality of color resistors located on a side of the black matrix away from the base substrate, and the color resistors are disposed at the first openings.

Optionally, in the display substrate provided in the embodiment of the present disclosure, an orthographic projection of the color resistors on the base substrate is intersected with the orthographic projection of the first openings on the base substrate, and intersected with an orthographic projection of an edge of the black matrix adjacent to the first openings on the base substrate.

In another aspect, a display device is further provided in an embodiment of the present disclosure, which includes the display substrate provided in the embodiments of the present disclosure.

DETAILED DESCRIPTION

Figure 1:
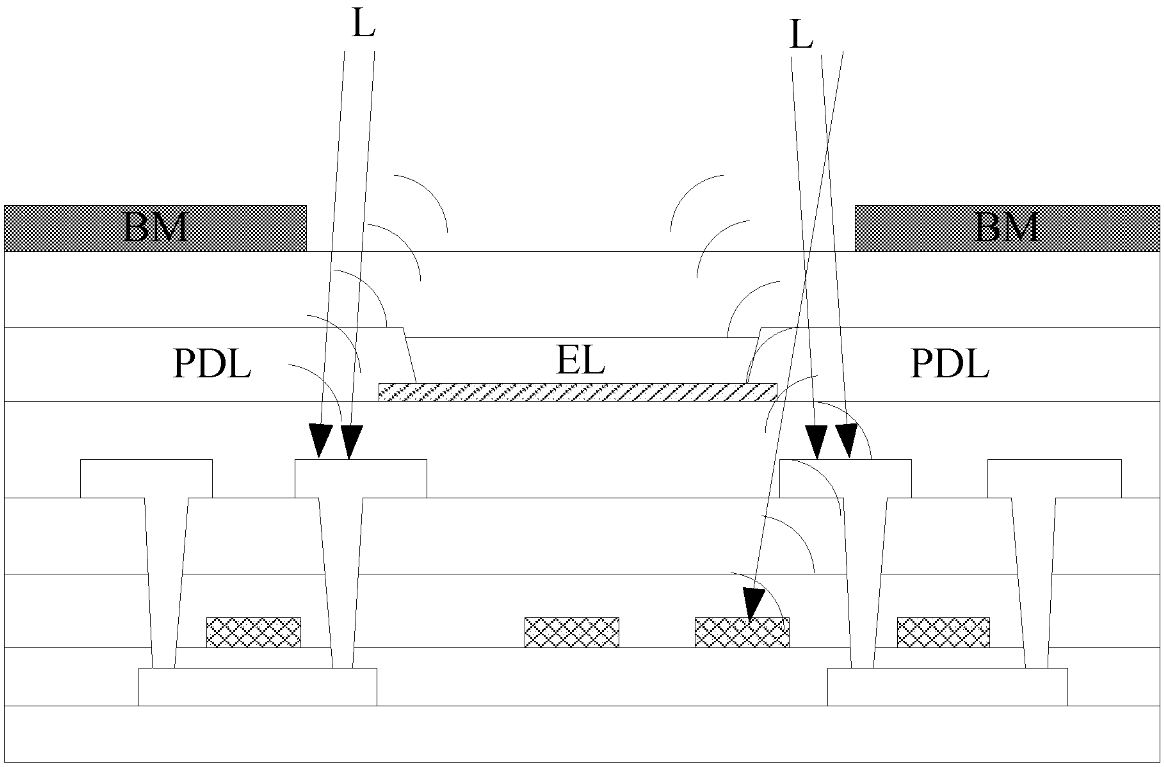
FIG. 1 is a schematic diagram of a structure of a display substrate in a related art.

In order to make objectives, technical solutions and advantages of the embodiments of the present disclosure more clear, the technical solutions of the embodiments of the present disclosure will be clearly and completely described below with reference to the drawings of the embodiments of the present disclosure. A thickness and a shape of each film layer in the drawings are not drawn to actual scale, the purpose of which is only to schematically illustrate the present disclosure. Apparently, the described embodiments are a part of the embodiments of the present disclosure, not all of the embodiments of the present disclosure. Based on the described embodiments of the present disclosure, all other embodiments obtained by those of ordinary skills in the art without inventive effort are covered by the scope of protection of the present disclosure.

Unless otherwise defined, technical terms or scientific terms used herein shall have an ordinary meaning understood by those with ordinary skills in the art to which the present disclosure pertains. Terms such as "first", "second" and the like used in the present disclosure do not indicate any order, quantity, or importance, but are used only for distinguishing different components. "Include", "contain", or similar words mean that elements or objects appearing before the words cover elements or objects listed after the words and their equivalents, but do not exclude other elements or objects. "Inside", "outside", "upper", "lower", etc., are merely used to represent relative position relations, and when an absolute position of a described object is changed, the relative position relation may also be correspondingly changed.

In a field of self-luminous color display, by integrating a Color Filter (CF for short) on an Encapsulation layer (COE for short) instead of circular polarizer, a thickness of a self-luminous display panel can be greatly reduced, a reflectivity of the self-luminous display panel can be reduced, and a color purity can be improved.

The color filter includes a Black Matrix (BM for short) and a plurality of color resistors, wherein the black matrix has a plurality of openings, the color resistors are disposed at the openings, and the color resistors may include a red color resistor R, a green color resistor G, a blue color resistor B, and the like. Generally, a light emitting device EL is provided below each color resistor, and the light emitting device EL is located at an opening of a Pixel Definition Layer (PDL for short). In a related art, in order to increase a luminous efficiency of the light emitting device EL, an opening of the black matrix BM is set to be larger than the opening of the pixel definition layer PDL. That is, the opening of the black matrix BM is outwardly expanded relative to the opening of the pixel definition layer PDL.

In this way, a resulting problem is that when the opening of the black matrix BM is extended outwardly for a certain distance from the opening of the pixel definition layer PDL, a metal wire that is not covered by an anode of the light emitting device EL is exposed below the opening of the Black Matrix BM. In this way, external ambient light is directly incident on the exposed metal wire through the openings of the black matrix BM to form reflected light in an irregular propagation direction, and parasitic reflected light is emitted from the openings of the black matrix BM, resulting in dispersed color spots, which is also referred to as color separation.

Another noteworthy problem is that diffraction of the external ambient light occurs after the ambient light passing through the openings of the black matrix BM (as shown in FIG. 1), resulting in a larger dispersion range of the diffracted light in a microstructure. In this way, if there is a metal wire in a spread range of the diffracted light, emergence of irregular light is further aggravated, resulting in stacking of diffracted light through a red color barrier R, a green color barrier G and a blue color barrier B, showing obvious color separation phenomenon.

Figure 2:
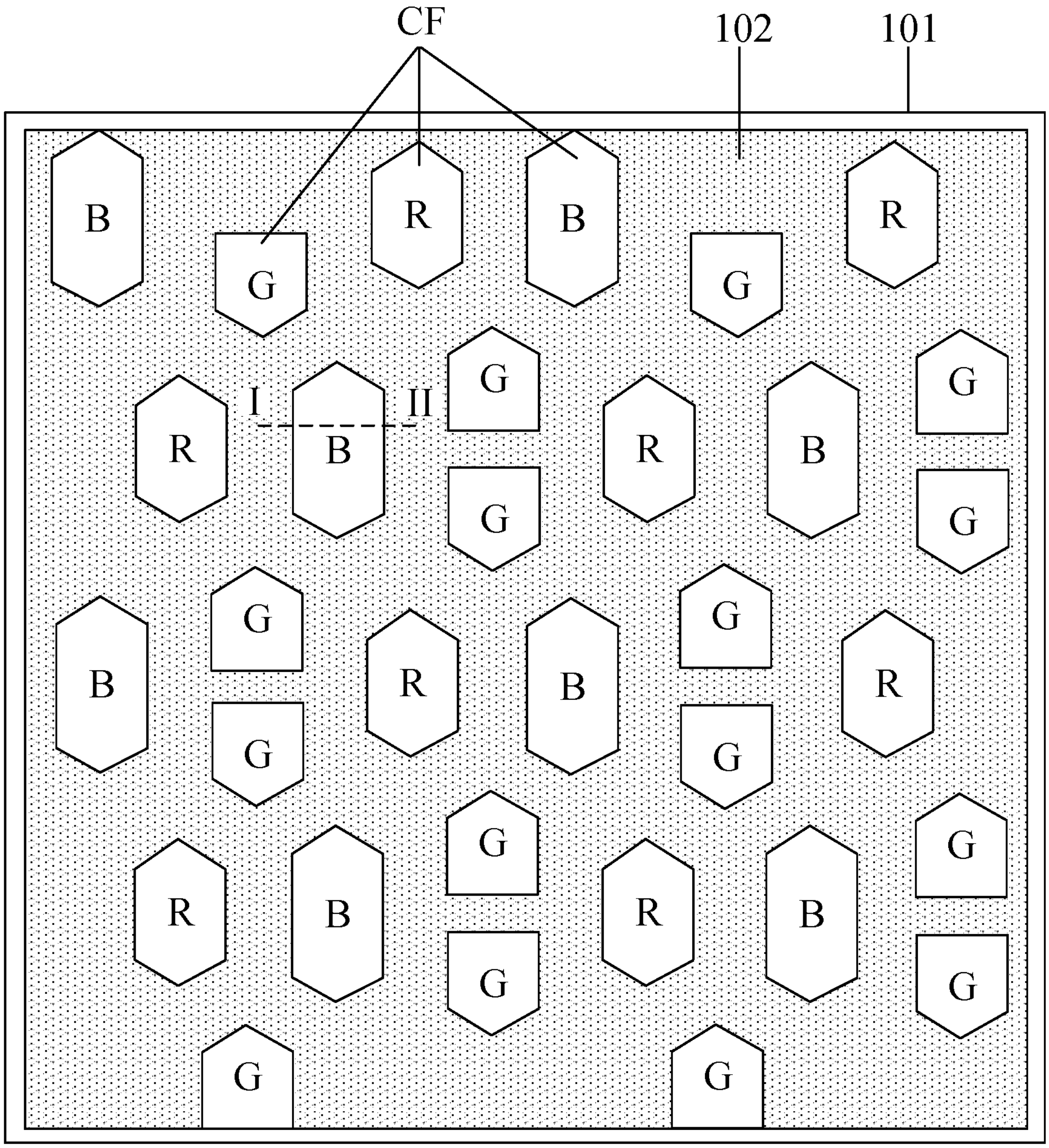
FIG. 2 is a schematic diagram of a structure of a display substrate according to an embodiment of the present disclosure.
Figure 3:
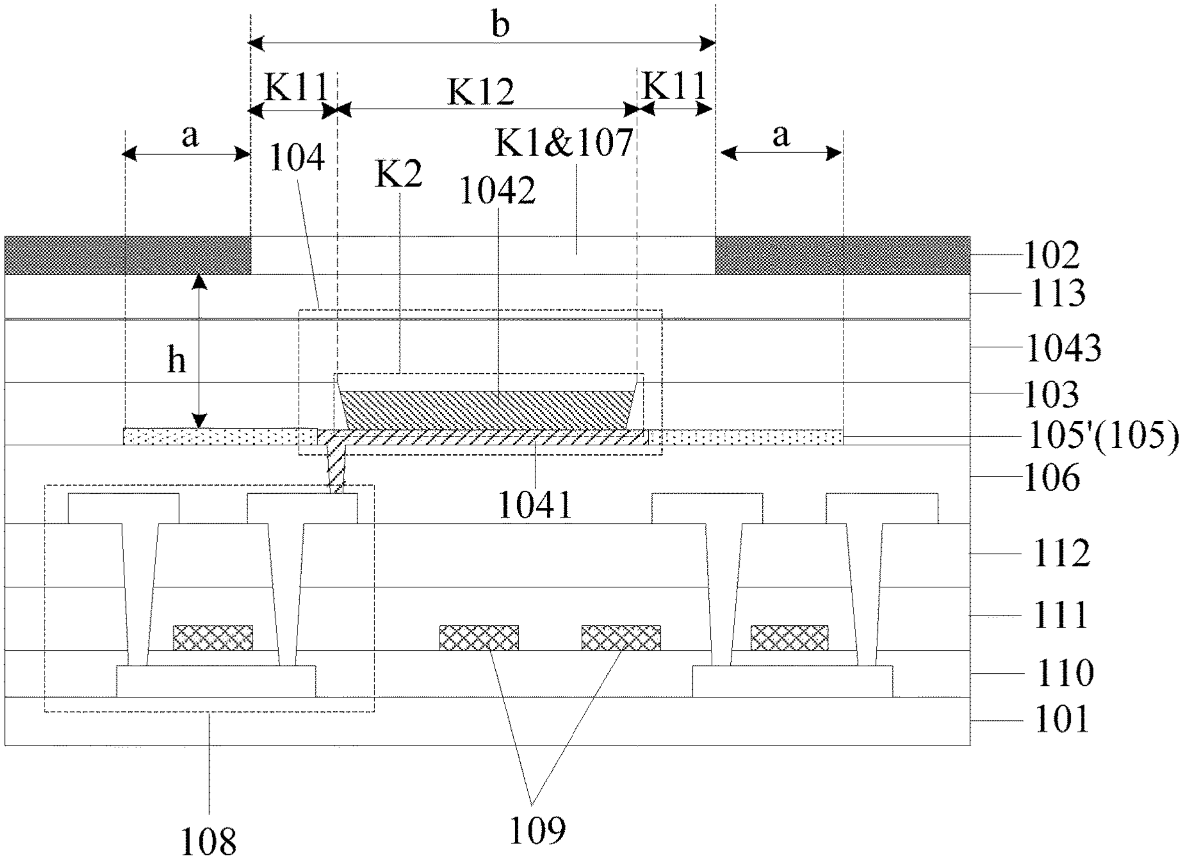
FIG. 3 is a schematic view of a cross-sectional structure taken along a line I-II in FIG. 2.

To solve at least the above technical problems in the related art, a display substrate is provided in an embodiment of the present disclosure, as shown in FIGS. 2 and 3, the display substrate may include:

a base substrate 101; a black matrix 102, which is located on the base substrate 101 and includes a plurality of first openings K1, wherein an first opening K1 includes a first portion K11 and a second portion K12 that is wound by the first portion K11; a pixel definition layer 103, which is located between a layer where the black matrix 102 is located and the base substrate 101; wherein the pixel definition layer 103 includes a plurality of second openings K2, an orthographic projection of the second openings K2 on the base substrate 101 is intersected with an orthographic projection of the second portions K12 on the base substrate 101, and the orthographic projection of the second openings K2 on the base substrate 101 is not intersected with an orthographic projection of the first portions K11 on the base substrate 101; a plurality of light emitting devices 104 which are located between the layer where the black matrix 102 is located and the base substrate 101, wherein a light emitting device 104 includes a reflecting electrode 1041 disposed at a second opening K2; and a shading layer 105 which is located between the pixel definition layer 103 and the base substrate 101, wherein an orthographic projection of the shading layer 105 on the base substrate 101 covers, at least, the orthographic projection of the first portions K11 on the base substrate 101.

In the display substrate provided in the embodiment of the present disclosure, the first portions K11 (i.e., a region where each of the first openings K1 is larger than a corresponding second opening K2) are blocked by the shading layer 105, thereby avoiding irregular reflection occurred after diffracted light passing through the first opening K1 irradiates an exposed metal wire below the reflecting electrode 1041, and thus a color separation phenomenon can be effectively weakened.

Figure 4:
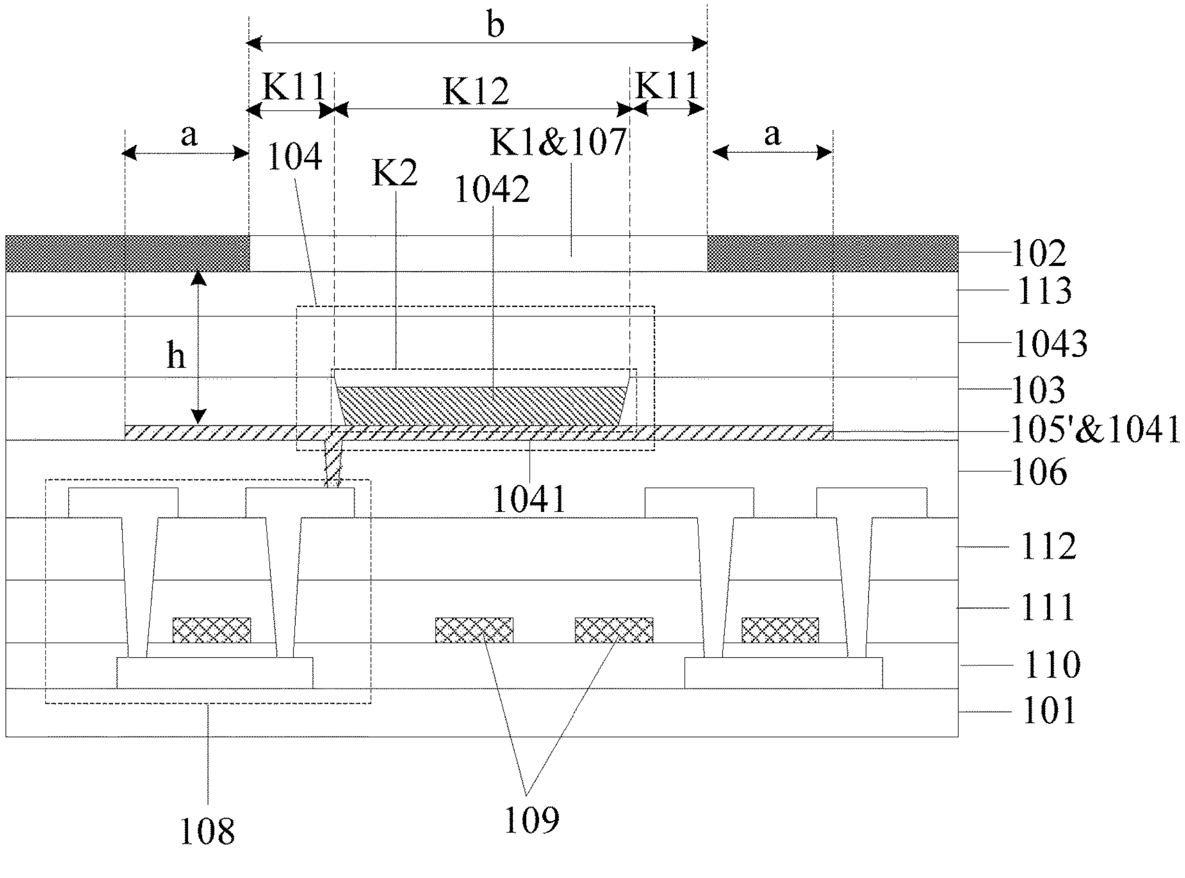
FIG. 4 is a schematic view of another cross-sectional structure taken along a line I-II in FIG. 2.

In some embodiments, in the display substrate provided in the embodiment of the present disclosure, as shown in FIGS. 3 and 4, the shading layer 105 may include a plurality of shading structures 105', and an orthographic projection of the shading structures 105' on the base substrate 101 may overlap with an orthographic projection of the first openings K1, outside a region where the reflecting electrodes 1041 are located, on the base substrate 101, and overlap with an orthographic projection of a portion of the black matrix 102 adjacent to the first openings K1 on the base substrate 101. When the orthographic projection of the shading structures 105' on the base substrate 101 overlaps with the orthographic projection of the first openings K1, outside the region where the reflecting electrodes 1041 are located, on the base substrate 101, the shading structures 105' can block diffracted light perpendicularly incident from the first openings K1, and the shading structures 105' laps with the reflecting electrodes 1041 to avoid a light leak phenomenon. When the orthographic projection of the shading structures 105' on the base substrate 101 overlaps with the orthographic projection of the portion of the black matrix 102 adjacent to the first openings K1 on the base substrate 101, the shading structures 105' can block diffracted light obliquely incident from the first openings K1. Based on this, incidence of diffracted light on a metal wire which is exposed by the first openings K1 and not covered by the reflecting electrodes 1041 can be avoided to a maximum extent, so that the color separation phenomenon can be greatly reduced.

Figure 5:
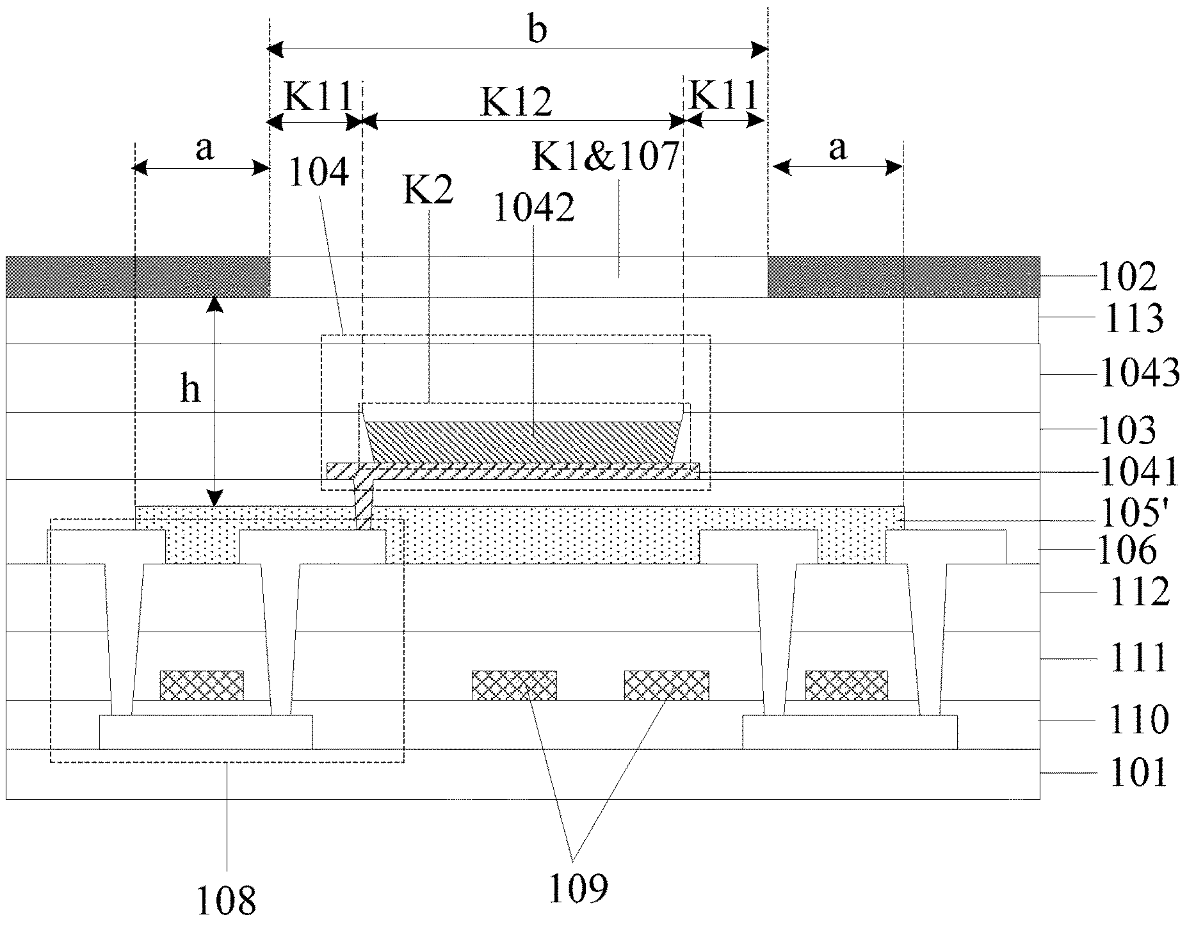
FIG. 5 is a schematic view of another cross-sectional structure taken along a line I-II in FIG. 2.
Figure 6:
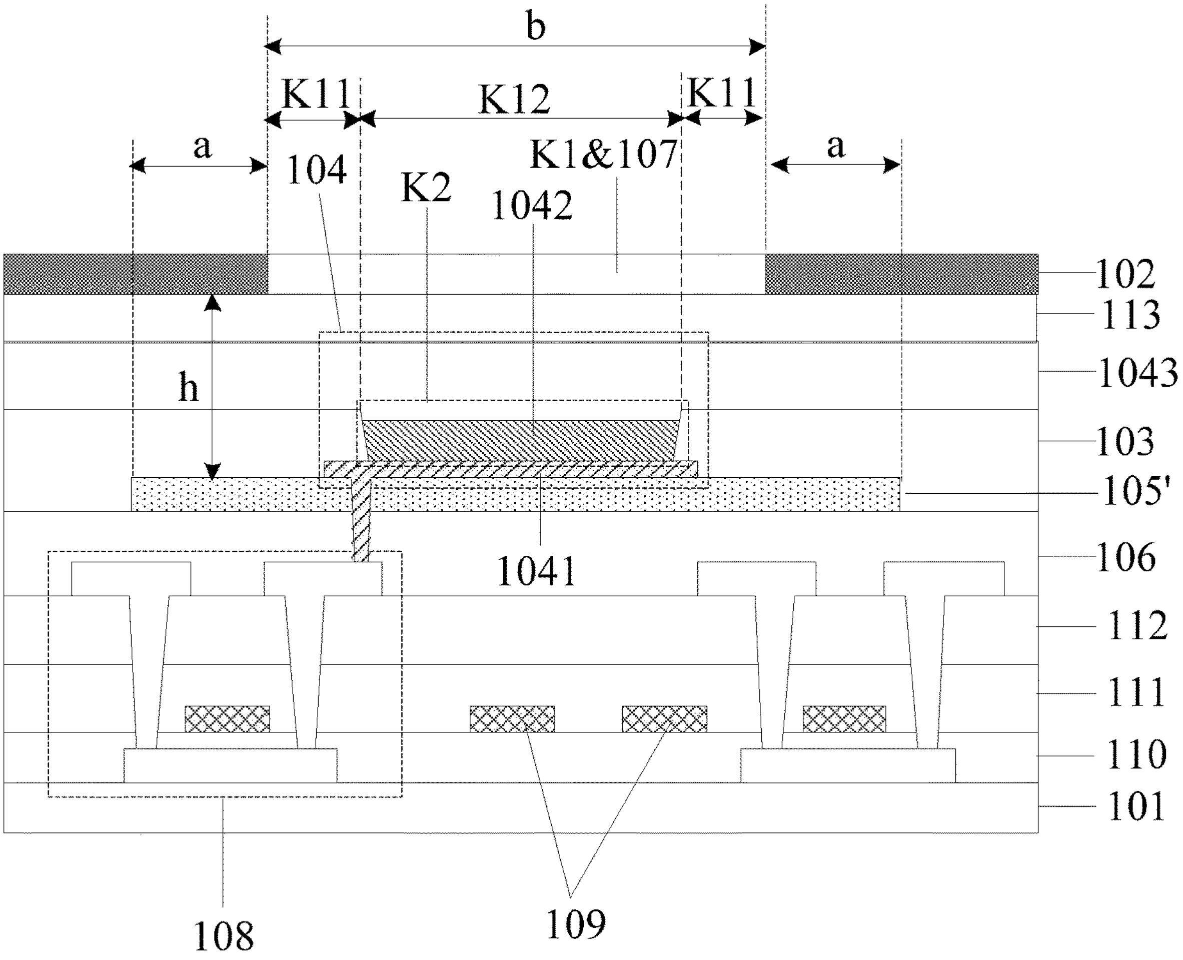
FIG. 6 is a schematic view of another cross-sectional structure taken along a line I-II in FIG. 2.

In some embodiments, in the display substrate provided in the embodiment of the present disclosure, as shown in FIGS. 5 and 6, the shading layer 105 may include a plurality of shading structures 105', and an orthographic projection of the shading structures 105' on the base substrate 101 covers an orthographic projection of the first openings K1 on the base substrate 101, and an orthographic projection of a portion of the black matrix 102 adjacent to the first openings K1 on the base substrate 101. Based on a same principle described above, the shading structures 105' in the embodiment can block, at a same time, diffracted light perpendicularly and obliquely incident from the first openings K1, thereby greatly weakening or even eliminating the color separation phenomenon. Furthermore, reflecting electrodes 1041 are disposed in the second openings K2, and the second openings K2 are smaller than the first openings K1, so that when the orthographic projection of the shading structures 105' on the base substrate 101 covers the orthographic projection of the first openings K1 on the base substrate 101, the shading structures 105' can improve flatness of the reflecting electrodes 1041 and facilitate improvement of the defect of color cast.

After the external ambient light passes through a pinhole of the first openings K1, there are light and dark diffraction fringes (equivalent to pinhole diffraction), and intensities of the diffraction fringes at all levels decreases in steps. A ratio of a luminous intensity at all levels to a general luminous intensity has a following relationship:

$$\frac{I_0}{I}=\left(\frac{\mathrm{Sin}\beta}{\beta}\right)^2$$

(where β is a center position of bright fringes at all levels); where $I_0$ is a luminous intensity at which the diffracted light passing through the first openings K1 of the black matrix 102 reaches an outer boundary of the shading structure 105' (that is, a boundary away from the first openings K1), I is a luminous intensity of the external ambient light incident on the first openings K1, and $I_0/I$ of a tenth-level bright fringe is equal to 0.00092, that is, the diffraction intensity of the tenth-level bright fringe is less than 1/1000 of the general luminous intensity, which basically avoids a range of the pinhole diffraction. For example, the luminous intensity of the external ambient light incident on the first openings K1 is 2000 nit, and the luminous intensity diffracted to this position is only 2 nit, so its color luminous intensity can be regarded as weak, and even if there is reflection of irregular metal wires, its luminous intensity is extremely weak, which can be regarded as having no influence on color separation. Therefore, the tenth-level bright fringe can be defined as the outer boundary of the shading structures 105'.

Specifically, a width of a tenth-level main peak is a=2*h*λ/b (i.e., a main diffraction peak)+10*h*λ/b (i.e., 10 secondary diffraction peaks)=12*h*λ/b. Suppose: h=11 μm, λ=550 nm, b=20 μm, then a=3.63 μm.

Based on this, in the display substrate provided in the embodiment of the present disclosure, in order to block most of the diffracted light at the first openings K1 of the black matrix 102, as shown in FIGS. 2 to 6, the shading structures 105' and the black matrix 102 may satisfy a following relationship:

$$a\geq\frac{12\ h\lambda}{b};$$

where a is a distance between a boundary of the orthographic projection of the shading structures 105' on the base substrate 101 away from the first opening K and a boundary of the orthographic projection of the first opening K on the base substrate 101, b is a distance between parallel sides of the first opening K1, h is a distance between the layer where the black matrix 102 is located and a layer where the shading structures 105' are located, and λ is a wavelength of incident light.

It is noted that due to a limitation on process conditions or an influence of other factors such as measurement, the parallel sides of the first opening K1 may be parallel, and there may be some deviations (for example, the included angle is ±10°). Therefore, a "parallel" relationship between the parallel sides of the first opening K1 belongs to the protection scope of the present disclosure as long as an error is within the range allowed.

It should be noted that, in some embodiments, the shading structure 105' may be flexibly disposed with respect to an epitaxial portion of the black matrix 102 according to a magnitude of the luminous intensity of the external ambient light incident on the first opening K1, as long as the diffracted light, which is transmitted through the black matrix 102 and reaches to the outer boundary of the shading structure 105' away from the first opening K1, has a small intensity (e.g. less than 10 nit).

In some embodiments, in the display substrate provided in the embodiment of the present disclosure, as shown in FIG. 3, the shading structure 105' may be in a same layer as the reflecting electrode 1041, and a material of the shading structure 105' may be a black material. The shading structure 105' is in the same layer as the reflecting electrode 1041, a quantity of film layers can be reduced, which facilitates achieving the thinning design of products. The black material of the shading structure 105' can greatly absorb the diffracted light, reduce the light incident on the metal wire, and weaken a dispersion phenomenon. In some embodiments, the black material may include an inorganic metal oxide, an organic black rubber material or the like, which is not limited specifically.

In some embodiments, in the display substrate provided in the embodiment of the present disclosure, the shading structure 105' and the reflecting electrode 1041 may be in an integral structure as shown in FIG. 4. In other words, after the reflecting electrode 1041 is expanded outwardly, an expanded portion may be used as the shading structure 105'. The diffracted light is specularly reflected on the reflecting electrode 1041, and a propagation direction of the reflected light is relatively regular. Therefore, the expanded reflecting electrode 1041 can play a role of the shading structure 105' concurrently, and can achieve a technical effect of weakening the color separation phenomenon.

In some embodiments, the display substrate provided in the embodiment of the present disclosure, as shown in FIG. 5, may further include a planarization layer 106 between the layer where the reflecting electrode 1041 is located and the base substrate 101, and the shading structure 105' may be located between the base substrate 101 and the planarization layer 106. In this case, the shading structure 105' can improve a flatness of the reflecting electrode 1041 and improve the color cast problem while improving the color separation phenomenon.

In some embodiments, the display substrate provided in the embodiment of the present disclosure, as shown in FIG. 6, may further include a planarization layer 106 between the layer where the reflecting electrode 1041 is located and the base substrate 101, and the shading structure 105' may be located between the base substrate 101 and the layer where the reflecting electrode 1041 is located. In this case, the shading structure 105' can improve a flatness of the reflecting electrode 1041 and improve the color cast problem while improving the color separation phenomenon.

In some embodiments, in the display substrate provided in the embodiment of the present disclosure, as shown in FIGS. 3 to 6, the light emitting device 104 may further include a light emitting functional layer 1042 and a transmissive electrode 1043, wherein the light emitting functional layer 1042 is located between the layer where the reflecting electrode 1041 is located and a layer where the transmissive electrode 1043 is located, and the transmissive electrode 1043 is located between the layer where the black matrix 102 is located and the layer where the reflecting electrode 1041 is located. In some embodiments, the reflecting electrode 1041 may be an anode, the transmissive electrode 1043 may be a cathode, and the light emitting functional layer 1042 may include, but is not limited to, a hole injection layer, a hole transport layer, an electron barrier layer, a luminescent material layer, a hole barrier layer, an electron transport layer, and an electron injection layer.

In some embodiments, in the display substrate provided in the embodiment of the present disclosure, the transmissive electrodes 1043 of a plurality of light emitting devices 104 may be in an integral structure, so as to uniformly load a driving signal to transmissive electrodes 1043 of the light emitting devices 104.

In some embodiments, the display substrate provided in the embodiment of the present disclosure, as shown in FIGS. 2 to 6, may further include a plurality of color resistors 107 located on a side of the black matrix 102 away from the base substrate 101, and the color resistors 107 may be disposed at the first openings K1. In some embodiments, the color resistors 107 may include a red color resistor R, a green color resistor G, a blue color resistor B and the like, which are not specifically limited herein.

Figure 7:
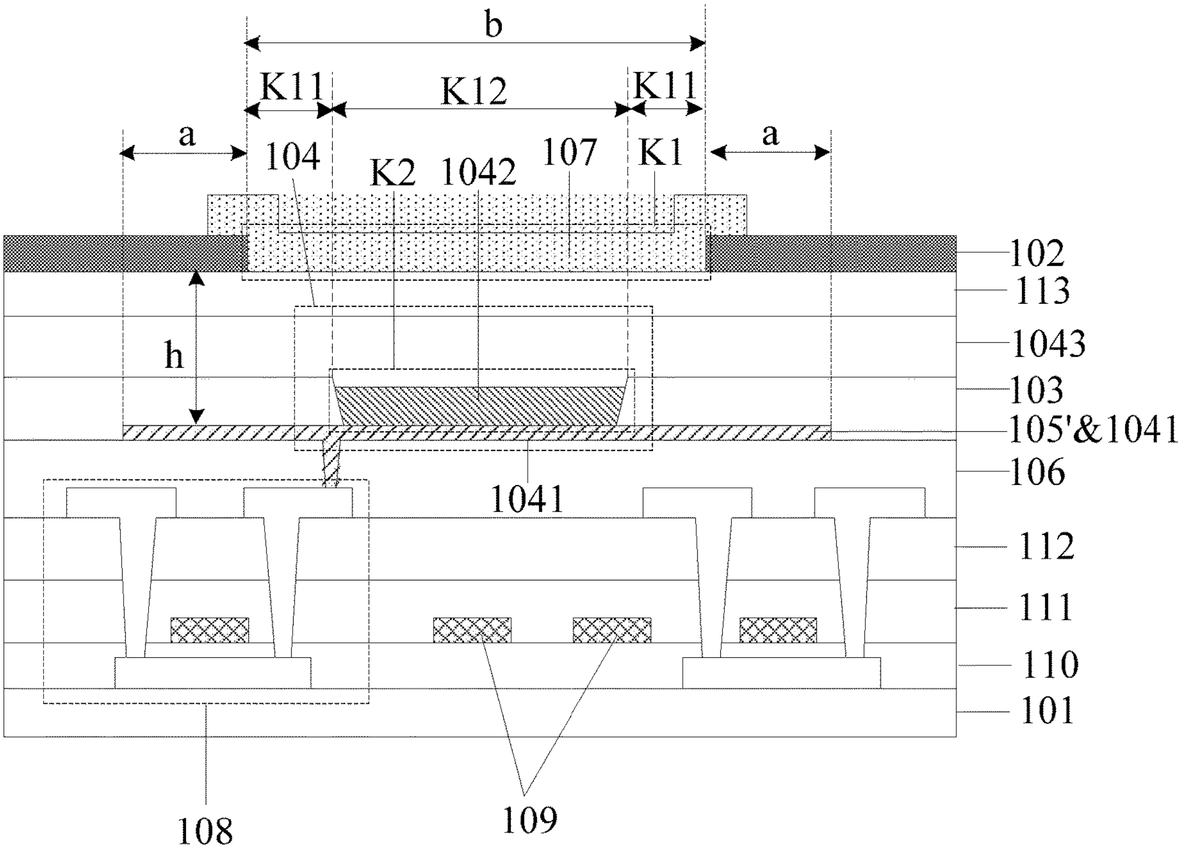
FIG. 7 is a schematic view of another cross-sectional structure taken along a line I-II in FIG. 2.

In some embodiments, as shown in FIGS. 2 to 6, an orthographic projection of the color resistors 107 on the base substrate 101 may be within the orthographic projection of the first openings K1. In some embodiments, as shown in FIG. 7, the orthographic projection of the color resistors 107 on the base substrate 101 may intersect with the orthographic projection of the first openings K1 on the base substrate 101 and an orthographic projection of an edge of the black matrix 102 adjacent to the first openings K1 on the base substrate 101.

Generally, the display substrate provided in the embodiment of the present disclosure, as shown in FIGS. 3 to 7, may further include a transistor 108, a gate line 109, a data line (not shown in the figures), a gate insulation layer 110, a first interlayer dielectric layer 111, a second interlayer dielectric layer 112, a thin film encapsulation layer 113 and the like. The transistor 108 may be an amorphous silicon transistor, an oxide transistor, a low temperature polysilicon transistor and the like, which is not limited herein. The thin film encapsulation layer 113 is located between the layer where the transmissive electrode 1043 is located and the layer where the black matrix 102 is located, and the thin film encapsulation layer 113 may include two inorganic thin film encapsulation layers and an organic encapsulation layer located between the two inorganic thin film encapsulation layers. Essential components included in the display substrate which should be understood to be included in the display substrate by those of ordinary skilled in the art will not be described repeatedly herein, and should not be taken as a limitation on the present disclosure.

Based on the same inventive concept, a display device is further provided in an embodiment of the present disclosure, which includes the display substrate provided in the embodiments of the present disclosure. Since a principle of solving problems of the display device is similar to a principle of solving problems of the display substrate, an implementation of the display device provided in the embodiment of the present disclosure can refer to the implementation of the display substrate above, any repetitive details will not be repeated again.

In some embodiments, the display device may be applied to the field of organic electroluminescent display technologies, the field of quantum dot luminescent display technologies, and the like. Alternatively, the display device may be any product or component with a display function such as a mobile phone, a tablet computer, a TV set, monitor, a laptop computer, a digital photo frame, a navigator, a smart watch, a fitness wristband, a personal digital assistant, etc. The display device includes, but is not limited to, a radio frequency unit, a networking module, an audio output-input unit, a sensor, a display unit, a user input unit, an interface unit, a memory, a processor, and a power supply. In addition, it will be understood by those skilled in the art that the above structure is not a limitation on the display device provided in the embodiments of the present disclosure. In other words, the display device provided in the embodiments of the present disclosure may include more or less of the components described above, or some components combined, or different component arrangements.

Apparently, those skilled in the art can make various modifications and variations to the embodiments of the present invention without departing from the spirit and scope of the embodiments of the present invention. Thus, if these modifications and variations to the embodiments of the present invention fall within the scope of the claims of the present invention and their equivalent techniques, the present invention is intended to include these modifications and variations.

The invention claimed is:

1. A display substrate, comprising:

a base substrate;

a black matrix, located on the base substrate, and comprises a plurality of first openings, wherein each first opening of the plurality of first openings comprises a first portion and a second portion that is wound by the first portion;

a pixel definition layer, located between a layer where the black matrix is located and the base substrate, wherein the pixel definition layer comprises a plurality of second openings, an orthographic projection of at least one second opening of the plurality of second openings on the base substrate is intersected with an orthographic projection of the second portion on the base substrate, and the orthographic projection of the second opening on the base substrate is not intersected with an orthographic projection of the first portion on the base substrate;

a plurality of light emitting devices, located between the layer where the black matrix is located and the base substrate, wherein at least one light emitting device of the plurality of light emitting devices comprises a reflecting electrode disposed at the second opening; and a shading layer, located between the pixel definition layer and the base substrate, and an orthographic projection of the shading layer on the base substrate covers, at least, the orthographic projection of the first portion on the base substrate, wherein the shading layer comprises a plurality of shading structures, wherein an orthographic projection of the first opening on the base substrate is entirely within an orthographic projection of at least one shading structure of the plurality of shading structures on the base substrate, and an orthographic projection of a portion of the black matrix adjacent to the first opening on the base substrate is within the orthographic projection of the at least one shading structure of the plurality of shading structures on the base substrate, and wherein the shading structure and the black matrix satisfy the following relationship:

$$a \geq \frac{12\, h\lambda}{b},$$

where a is a distance between a boundary of the orthographic projection of the shading structure on the base substrate away from the first opening and a boundary of the orthographic projection of the first opening on the base substrate, b is a distance between parallel sides of the first opening, h is a distance between the layer where the black matrix is located and a layer where the shading structure is located, and λ is a wavelength of incident light.

2. The display substrate of claim 1, wherein the shading structure is in a same layer as the reflecting electrode, and a material of the shading structure is a black material.

3. The display substrate of claim 1, wherein the shading structure and the reflecting electrode are in an integral structure.

4. The display substrate of claim 1, further comprising: a planarization layer between a layer where the reflecting electrode is located and the base substrate, wherein the shading structure is located between the base substrate and the planarization layer.

5. The display substrate of claim 1, further comprising: a planarization layer between a layer where the reflecting electrode is located and the base substrate, wherein the shading structure is located between the base substrate and the layer where the reflecting electrode is located.

6. The display substrate of claim 1, wherein:

the light emitting device further comprises a light emitting functional layer and a transmissive electrode;

the light emitting functional layer is located between a layer where the reflecting electrode is located and a layer where the transmissive electrode is located; and the transmissive electrode is located between the layer where the black matrix is located and the layer where the reflecting electrode is located.

7. The display substrate of claim 6, wherein transmissive electrodes of the plurality of light emitting devices are in an integral structure.

8. The display substrate of claim 1, further comprising: a plurality of color resistors located on a side of the black matrix away from the base substrate, wherein the color resistors are disposed at the first openings.

9. The display substrate of claim 8, wherein: an orthographic projection of the color resistors on the base substrate is intersected with orthographic projections of the first openings on the base substrate, and intersected with an orthographic projection of an edge of the black matrix adjacent to the first openings on the base substrate.

10. A display device, comprising the display substrate of claim 1.

11. The display substrate of claim 1, wherein:

the light emitting device further comprises a light emitting functional layer and a transmissive electrode;

the light emitting functional layer is located between a layer where the reflecting electrode is located and a layer where the transmissive electrode is located; and the transmissive electrode is located between the layer where the black matrix is located and the layer where the reflecting electrode is located.

12. The display substrate of claim 1, further comprising: a plurality of color resistors located on a side of the black matrix away from the base substrate, wherein the color resistors are disposed at the first openings.

* * * * *